(12) United States Patent
Mohajerani et al.

(10) Patent No.: US 9,082,993 B2
(45) Date of Patent: Jul. 14, 2015

(54) ORGANIC LIGHT EMITTING DIODES HAVING INCREASED ILLUMINATION

(76) Inventors: Ezeddin Mohajerani, Tehran (IR); Jalal Jafari, Tehran (IR)

( * ) Notice: Subject to any disclaimer, the term of this patent is extended or adjusted under 35 U.S.C. 154(b) by 0 days.

(21) Appl. No.: 13/605,829

(22) Filed: Sep. 6, 2012

(65) Prior Publication Data

US 2012/0326142 A1  Dec. 27, 2012

Related U.S. Application Data

(60) Provisional application No. 61/531,426, filed on Sep. 6, 2011.

(51) Int. Cl.
*H01L 51/52* (2006.01)
*H01L 51/50* (2006.01)

(52) U.S. Cl.
CPC ........................... *H01L 51/50* (2013.01)

(58) Field of Classification Search
USPC ............... 257/40, 143–144, 149–152, E51.18
See application file for complete search history.

(56) References Cited

U.S. PATENT DOCUMENTS

| | | | | |
|---|---|---|---|---|
| 7,679,102 B2* | 3/2010 | Chik et al. | ..................... | 257/102 |
| 2008/0093608 A1* | 4/2008 | Chik et al. | ..................... | 257/89 |
| 2008/0191626 A1* | 8/2008 | Salter et al. | ..................... | 315/77 |
| 2009/0014741 A1* | 1/2009 | Masuda et al. | ................. | 257/98 |
| 2012/0320607 A1* | 12/2012 | Kinomoto et al. | ............ | 362/351 |

* cited by examiner

*Primary Examiner* — Thanh Nguyen

(74) *Attorney, Agent, or Firm* — Van Dyke Law; Raymond Van Dyke

(57) ABSTRACT

OLEDs having increased illumination are disclosed. The OLEDs have light emitting layers with periodic grain sizes. In particular, by depositing smaller particles at the boundaries of the emitting layers, the injection rate of carriers is improved in the emitting layers and by depositing larger particles in the middle of the emitting layers, the carrier density is increased, which increases electron-hole recombination. Increased recombination facilitates radiative emission of exitons from the OLED. As a result of the periodic grain size structure of the emitting layers, the electroluminescence and durability of the OLEDs are improved.

18 Claims, 6 Drawing Sheets

ORGANIC LIGHT EMITTING DIODES HAVING INCREASED ILLUMINATION

CROSS-REFERENCE TO RELATED APPLICATIONS

The present application claims the benefit of U.S. Provisional Patent Application Ser. No. 61/531,426, filed Sep. 6, 2011, which is incorporated herein by reference in its entirety.

SPONSORSHIP STATEMENT

This application has been financially sponsored for international filing by the Iranian Nanotechnology Initiative Council and the Shahid Beheshti University.

TECHNICAL FIELD

This application generally relates to light emitting diodes, and more particularly relates to organic light emitting diodes having increased illumination.

BACKGROUND

Organic light emitting diodes ("OLEDs") have been increasingly used in displays and for low-consumption illumination because of their fast switching time, flexibility, and highly efficient electroluminescence. In addition to their improved performance, OLEDs can be fabricated relatively easily using nature-friendly raw materials.

Currently, much research is directed towards improving the electroluminescence of OLEDs by modifying their diode structure. For example, the grain size of particles in an emitting layer of OLEDs can affect the performance of the OLEDs. In particular, it has been shown that reducing the grain size of particles in the emitting layer improves the electroluminescence of the OLEDs.

However, to increase the number of application for OLEDs, the performance of OLEDs must be further improved. In particular, illumination is an important factor for performance displays, such as televisions, monitors, and mobile displays. As such, a new OLED having increased illumination is needed.

SUMMARY

An organic light emitting diode is disclosed. The organic light emitting diode includes a substrate made of a non-conductive, transparent material, an anode made of a conductive, transparent material over the substrate, an emitting layer over the anode, and a cathode made of a metal over the emitting layer. The emitting layer includes first small particles at the lower boundary of the emitting layer, first intermediate-sized particles over the first small particles, first large particles over the first intermediate-sized particles, second intermediate-sized particles over the first large particles, second large particles over the second intermediate-sized particles, third intermediate-sized particles over the second large particles, and second small particles over the third intermediate-sized particles at the upper boundary of the emitting layer. The large particles of the emitting layer are larger than the intermediate-sized particles of the emitting layer and the intermediate-sized particles of the emitting layer are larger than the small particles of the emitting layer.

In some implementations, the emitting layer can be made of tris(8-hydroxyquinoline) aluminum. The thickness of the emitting layer can be 65 nanometers, the thickness of the emitting layer between the first small particles and the first large particles can be 10 nanometers, the thickness of the emitting layer between the first large particles and the second intermediate-sized particles can be 10 nanometers, the thickness of the emitting layer between the second intermediate-sized particles and the second large particles can be 10 nanometers, the thickness of the emitting layer between the second large particles and the third intermediate-sized particles can be 20 nanometers, and the thickness of the emitting layer between the third intermediate-sized particles and the second small particles can be 15 nanometers.

In some implementations, the substrate can be made of transparent glass, the anode can be made of indium tin oxide, and the cathode can be made of aluminum. In some implementations, the anode can be electrically connected to the cathode.

In some implementations, the organic light emitting diode further includes a hole injection layer being made of polymer over the anode. The hole injection layer can be made of poly(ethylenedioxy)thiophene:poly(styrenesulfonate) and have a thickness between 5 nanometers and 100 nanometers.

In some implementations, the organic light emitting diode further includes a hole transport layer made of another polymer over the hole injection layer. The hole transport layer can be made of poly(9-vinylcarbazole) and have a thickness between 50 nanometers and 200 nanometers.

Details of one or more implementations and/or embodiments of the organic light emitting diodes having increased illumination are set forth in the accompanying drawings and the description below. Other aspects that can be implemented will be apparent from the description and drawings, and from the claims.

BRIEF DESCRIPTION OF DRAWINGS

Like reference symbols indicate like elements throughout the specification and drawings.

DETAILED DESCRIPTION

OLEDs having increased illumination are disclosed. The OLEDs have light emitting layers with periodic grain sizes. In particular, by depositing smaller particles at the boundaries of the emitting layers, the injection rate of carriers is improved in the emitting layers and by depositing larger particles in the middle of the emitting layers, the carrier density is increased, which increases electron-hole recombination. Increased recombination facilitates radiative emission of exitons from the OLED. As a result of the periodic grain size structure of the emitting layers, the electroluminescence and durability of the OLEDs are improved.

Figure 1:
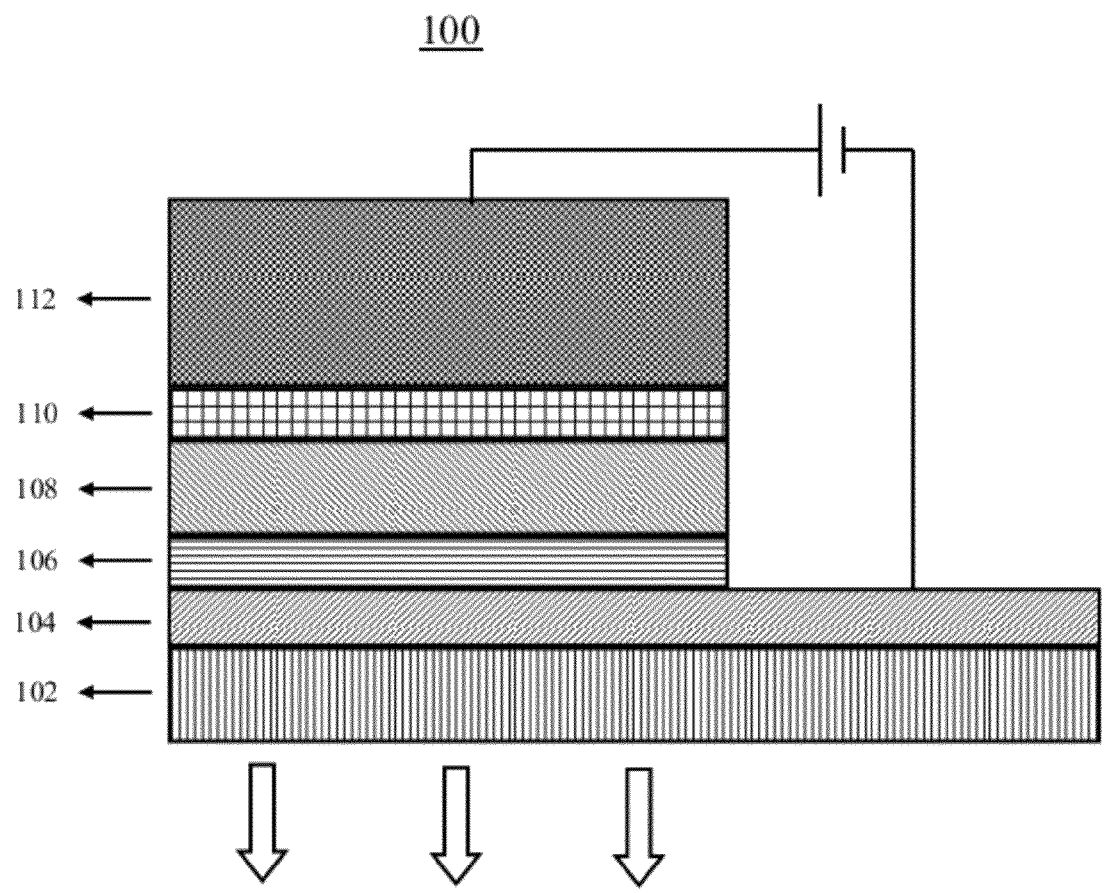
FIG. 1 illustrates a cross-sectional view of an OLED structure.

Referring to FIG. 1, a cross-sectional view of an OLED structure is illustrated. Although a relatively simple OLED structure is illustrated in FIG. 1, in some implementations, light emitting layers with periodic grain sizes according to this application can also be applied to other OLED structures. For example, in some implementations, a separate electron injecting layer can be added to the OLED structure of FIG. 1 to enhance the performance of the OLED.

As shown in FIG. 1, the OLED 100 includes a substrate 102, an anode 104 over the substrate 102, a hole injection layer 106 over the anode 104, a hole transport layer 108 over the hole injection layer 106, an emitting layer 110 over the hole transport layer 108, and a cathode 112 over the emitting layer 110. The anode 104 and the cathode 112 are connected to an electricity source. When electricity is applied to the OLED 100, charge carriers pass through the emitting layer 110 and light is emitted from the OLED 100 through the substrate 102, as shown by the arrows below the substrate 102.

The substrate 102 can be made of an organic material or an inorganic material that is non-conductive and transparent to allow for the transmission of light. In some implementations, the substrate 102 can be made of a plastic that is solid or flexible while in other implementations, the substrate 102 can be made of glass. In preferred implementations, the substrate 102 can be made of glass.

The anode 104 is coated on the upper surface of the substrate 102 and is made of a transparent, highly conductive material, such as indium tin oxide ("ITO"), indium-zinc oxide ("IZO"), tin oxide ($SnO_2$), or zinc oxide (ZnO). The anode 104 can be coated on the upper surface of the substrate 102 using a vacuum deposition or sputtering method. In preferred implementations, ITO coated glass having a sheet resistance between 8 $\Omega/cm^2$ and 20 $\Omega/cm^2$ can be used as the substrate 102 and anode 104.

The hole injection layer 106 is then formed on the upper surface of the anode 104 by various methods, such as vacuum-deposition and spin coating. In some implementations, the hole injection layer 106 can be made of a polymer having a conductivity capable of adjusting energy levels. Preferably, the polymer can be poly(ethylenedioxy) thiophene:poly(styrenesulfonate) ("PEDOT:PSS"). Preferably, the hole injection layer 106 can be spin coated on the upper surface of the anode 104 and the spinner can rotate between 2000 RPM and 5000 RPM. Following spin coating, the PEDOT:PSS can be baked at a temperature ranging from 50° C. to 250° C. and, preferably, 120° C. The thickness of the hole injection layer 106 can range from about 5 nm to 100 nm and, preferably, be about 55 nm. If the thickness of the hole injection layer 106 is less than 5 nm, hole injection properties of the hole injection layer 106 may not be sufficient. If the thickness of the hole injection layer 106 is greater than 100 nm, the driving voltage of the OLED 100 may increase.

The hole transport layer 108 is then formed on the upper surface of the hole injection layer 106 by various methods, such as vacuum-deposition and spin coating. In some implementations, the hole transport layer 108 can be made of a polymer having at least predetermined conductivity and energy levels. Preferably, the polymer is poly(9-vinylcarbazole) ("PVK") and is spin coated on the upper surface of the hole injection layer 106. The spinner can rotate between 2000 RPM and 5000 RPM and following the spin coating, the PVK can be baked at a temperature ranging from 50° C. to 250° C. and, preferably, 120° C. The thickness of the hole transport layer 108 can range from about 50 nm to 200 nm and, preferably, be about 100 nm.

The emitting layer 110 is then formed on the upper surface of the hole transport layer 108 by, for example, vacuum-deposition. The emitting layer 110 also acts as the electron transporting layer in the OLED 100. In some implementations, however, a separate electron transporting layer can be included in the OELD 100. Preferably, the emitting layer 110 can be made of tris(8-hydroxyquinoline) aluminum ("$Alq_3$"). The thickness of the emitting layer 110 can range from about 10 nm to 80 nm and, preferably, be about 65 nm to provide a proper electron-hole recombination zone.

The cathode 112 is then formed on the upper surface of the emitting layer 110 by, for example, vacuum-deposition. The cathode 112 can be made of a metal, such as calcium (Ca), magnesium (Mg), silver (Ag), aluminum (Al), lithium (Li), or alloys of two or more of these metals. Preferably, the cathode 112 can be made of aluminum and have a thickness sufficient to provide an effective contact with the emitting layer 110. In preferred implementations, the thickness of the cathode 112 can range from 100 nm to 300 nm and, preferably be about 200 nm.

To increase the illumination of the OLED 100 relative to known OLEDs, the deposition rate of the $Alq_3$ particles and, as such, the grain size of the $Alq_3$ particles in the emitting layer 110 are controlled to be periodic. In particular, by lowering the deposition rate of $Alq_3$, smaller grains are deposited in the emitting layer 110 and, similarly, by increasing the deposition rate of $Alq_3$, larger grains are deposited.

Figure 2:
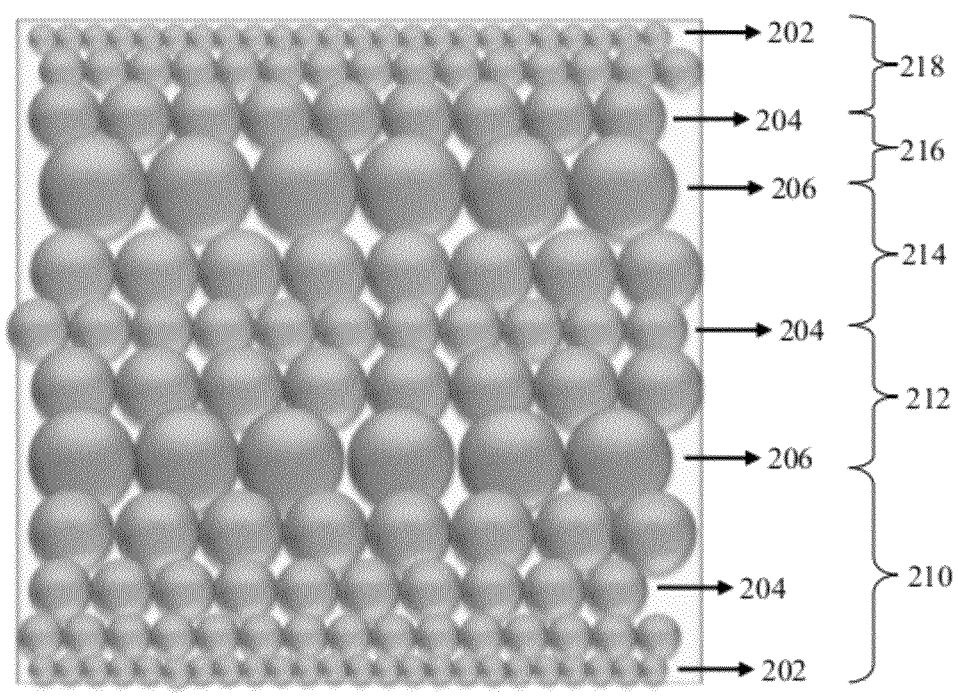
FIG. 2 illustrates a schematic view of the grain size distribution of $Alq_3$ particles in an emitting layer of an OLED.

Referring to FIG. 2, the grain size of the $Alq_3$ particles 202 immediately above the hole transport layer 108 are the smallest as the lowest deposition rate is used to deposit the $Alq_3$ particles. Relative to known OLEDs having $Alq_3$ particles with a consistent size, smaller grain sizes in the emitting layer 110 at the interface of the hole transport layer 108 enables improved mobility of the holes from the hole transport layer 108 into the emitting layer 110, thereby shifting the population of holes from the hole transport layer 108 interface towards the middle of the emitting layer 110. This shift results in lower non-radiative emission at the interface between the hole transport layer 108 and the emitting layer 110, thereby reducing the heat produced by the OLED and, thus, improving the stability and illumination of the OLED.

The deposition rate of the $Alq_3$ particles is then gradually increased to an intermediate rate resulting in deposition of medium-sized $Alq_3$ particles 204. Next, the deposition rate is again gradually increased to its highest rate resulting in the deposition of the largest $Alq_3$ particles 206. The deposition rate is then gradually decreased to the intermediate rate resulting in deposition of the medium-sized $Alq_3$ particles 204, followed by again gradually increasing the deposition rate to the highest rate resulting in the deposition of the largest $Alq_3$ particles 206, and gradually decreasing the deposition rate to the intermediate rate resulting in deposition of the medium-sized $Alq_3$ particles 204. By creating two layers of the largest $Alq_3$ particles 206 in the middle of the emitting layer 110, the mobility of the holes entering the emitting layer 110 from the hole transport layer 108 and the electrons entering the emitting layer 110 from the cathode 112 is impeded in two stages. As such, the likelihood of recombination between the holes and the electrons is increased, thereby lowering heat dissipation and improving illumination of the OLED.

Finally, the deposition rate is gradually decreased to the lowest rate resulting in deposition of the smallest $Alq_3$ particles 202 at the boundary between the emitting layer 110 and the cathode 112. Similar to the interface between the hole transport layer 108 and the emitting layer 110, smaller grain sizes in the emitting layer 110 at the interface of the cathode 112 enables improve mobility of the electrons from the cathode 112 into the emitting layer 110, thereby shifting the population of electrons from the cathode 112 interface towards the middle of the emitting layer 110. This shift results in lower non-radiative emission at the interface between the emitting layer 110 and the cathode 112, thereby reducing the heat produced by the OLED and, thus, improving the stability and illumination of the OLED.

In some implementations, the lowest deposition rate of $Alq_3$ in the emitting layer 110 is 0.05 Å/s, the intermediate deposition rate is 1.5 Å/s, and the highest deposition rate is 3 Å/s. The thickness 210 of the emitting layer 110 from the smallest $Alq_3$ particles 202 at the interface of the hole transport layer 108 to the first layer of the largest $Alq_3$ particles 206 is 10 nm. The thickness 212 of the emitting layer 110 from the first layer of the largest $Alq_3$ particles 206 to the second layer of the medium-sized $Alq_3$ particles 204 is also 10 nm. The thickness 214 of the emitting layer 110 from the second layer of medium-sized $Alq_3$ particles 204 to the second layer of the largest $Alq_3$ particles 206 is also 10 nm. The thickness 216 of the emitting layer 110 from the second layer of the largest $Alq_3$ particles 206 to the third layer of the medium-sized $Alq_3$ particles 204 is 20 nm. Finally, the thickness 218 of the emitting layer 110 from the third layer of the medium-sized $Alq_3$ particles 204 to the second layer of the smallest $Alq_3$ particles 202 is 15 nm. As such, the preferred complete thickness of the emitting layer 110 is 65 nm.

Therefore, a periodic, gradient deposition rate was used to deposit the emitting layer 110. For the first 10 nm of the emitting layer (210) starting at the interface between the hole transport layer 108 and the emitting layer 110, the rate was gradually increased from 0.05 Å/s to 3 Å/s. For the next 10 nm (212), the deposition rate was gradually reduced from 3 Å/s to 1.5 Å/s. For the next 10 nm (214), the deposition rate was increased from 1.5 Å/s back to 3 Å/s. For the next 20 nm (216), the deposition rate was again decreased from 3 Å/s to 1.5 Å/s and, for the final 15 nm (218), the deposition rate was decreased from 1.5 Å/s back to the starting deposition rate of 0.05 Å/s.

The periodic grain size of the $Alq_3$ particles in the emitting layer 110 as shown in FIG. 2 provides several advantages relative to known OLEDs having a consistent grain size in the emitting layer. First, as explained above, the injection and charge transport of electrons at the interface between the emitting layer 110 and the cathode 112 are improved by using the lowest deposition rate near upper boundary of the emitting layer 110, thereby reducing the size of the $Alq_3$ particles at this boundary.

Figure 3:
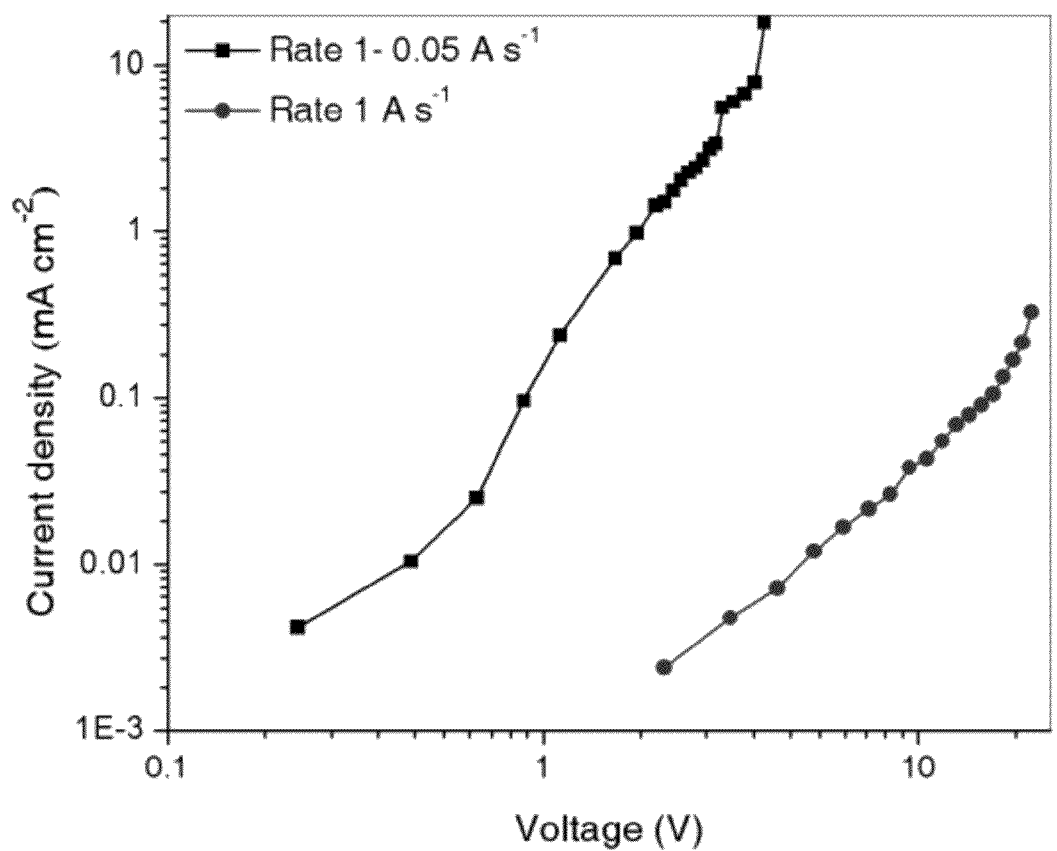
FIG. 3 illustrates a graph showing the current densities for a single layer device of $Alq_3$ at two different grain sizes as a function of applied voltage.

Referring to FIG. 3, the current densities of a single layer device of $Alq_3$ at two different grain sizes in the structure of a glass substrate 102, an ITO anode 104, an $Alq_3$ emitting layer 110 having a thickness of 65 nm, and an aluminum cathode 112 are illustrated. In the first device, the deposition rate of the $Alq_3$ particles in the emitting layer 110 is kept constant at 1 Å/s and, thus, the grain size of the $Alq_3$ particles is also constant. In the second device, the deposition rate of the $Alq_3$ particles in the emitting layer 110 is gradually decreased from 1 Å/s at the interface of the hole transport layer 108 to 0.05 Å/s at the interface of the cathode 112. Therefore, the grain size of the $Alq_3$ particles in the emitting layer 110 of the second device gradually decreases from the anode 104 to the cathode 112.

As shown in FIG. 3, the current density of the second device with the gradually decreasing $Alq_3$ deposition rate is significantly greater at lower voltages than the current density of the first device with the constant $Alq_3$ deposition rate. The greater current density is expected because the injection and mobility of the electrons entering the emitting layer 110 from the cathode 112 is higher in the second device due to the smaller grain size of the $Alq_3$ particles at the interface of the cathode 112.

Second, OLEDs having emitting layers 110 with $Alq_3$ deposited at a gradient deposition rate between 3 Å/s and 0.05 Å/s have increased current density and the luminance relative to OLEDs with Alq3 deposited at higher or lower maximum rates. This is because grain size of the $Alq_3$ particles deposited at 3 Å/s provides the highest recombination of holes and electrons in the center of the emitting layer 110 and, thus, the highest facilitation of the radiative emission of the exitons. In particular, referring to FIG. 4, the current densities and luminances of four example OLEDs having the OLED structure of FIG. 1 are illustrated. The structure of the OLEDs consists of a glass substrate 102, an ITO anode 104, a PEDOT:PSS hole injection layer 106 having a thickness of 55 nm, a PVK hole transport layer 108 having a thickness of 100 nm, an $Alq_3$ emitting layer 110 having a thickness of 65 nm, and an aluminum cathode 112. The current densities of the four OLEDs are shown by the solid lines and the luminances of the four OLEDs are shown by the dashed lines in FIG. 4.

Figure 4:
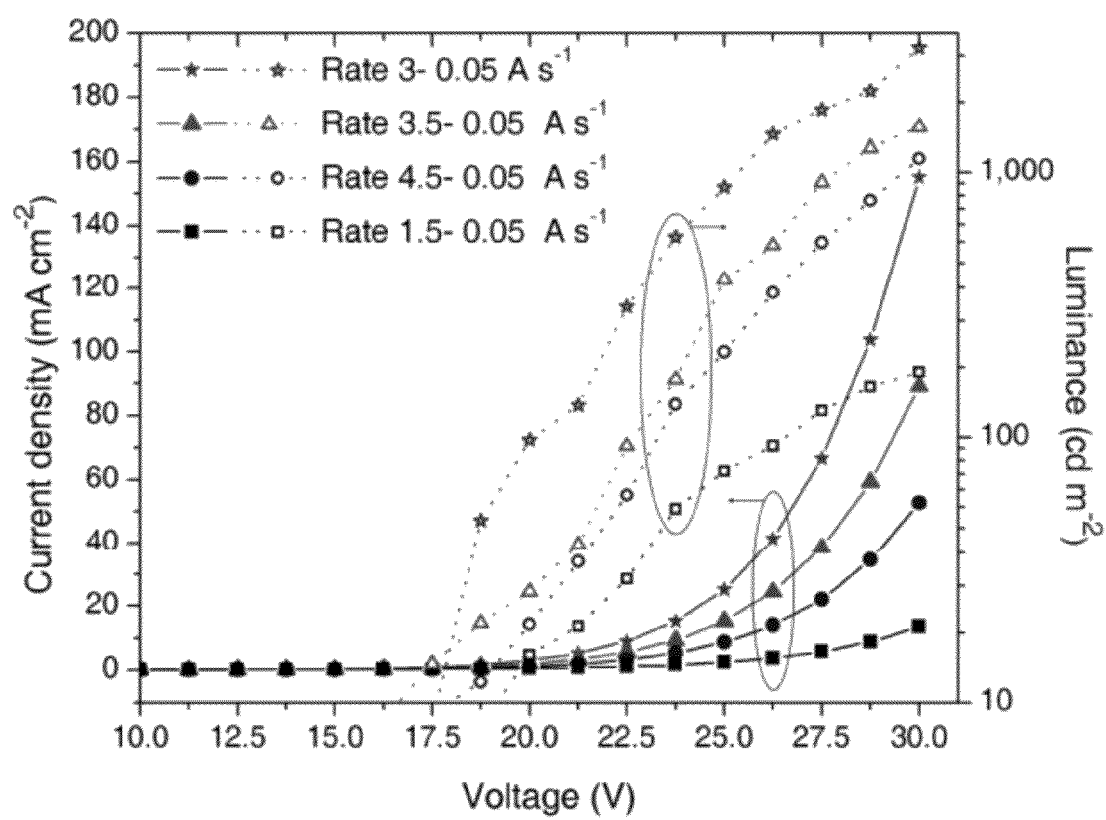
FIG. 4 illustrates a graph showing the current densities and luminances of four OLEDs having different gradient trends in evaporating $Alq_3$ particles in their emitting layers as a function of applied voltage.

In the first OLED, the deposition rate of the $Alq_3$ particles in the emitting layer 110 is gradually decreased from 1.5 Å/s at the hole transport layer 108 to 0.05 Å/s at the cathode 112. In the second OLED, the deposition rate of the $Alq_3$ particles is changed from 4.5 Å/s to 0.05 Å/s. In the third OLED, the deposition rate of the $Alq_3$ particles is changed from 3.5 Å/s to 0.05 Å/s. In the fourth OLED, the deposition rate of the $Alq_3$ particles is changed from 3 Å/s to 0.05 Å/s. As shown in FIG. 4, the fourth OLED having the gradient $Alq_3$ deposition rate of 3 Å/s to 0.05 Å/s exhibits both the highest current density and the highest luminance over the same voltage range.

Third, by shifting the hole populated areas from the boundaries of the hole transport layer 108 and the emitting layer 110, the non-radiative emission of exitons is reduced. As a result of the increase in the injection rate of electrons and holes, the electron-hole recombination is increased, which results in a decrease in turn-on voltage for the OLED 100. The decrease in non-radiative emission and turn-on voltage for the OLED 100, in turn, results in a more stable device. As such, because the $Alq_3$ particles near the boundaries of the emitting layer 110 were specifically configured to be smaller than the $Alq_3$ particles near the middle of the emitting layer 110, a periodic $Alq_3$ particle size is formed within the emitting layer 110.

Figure 5:
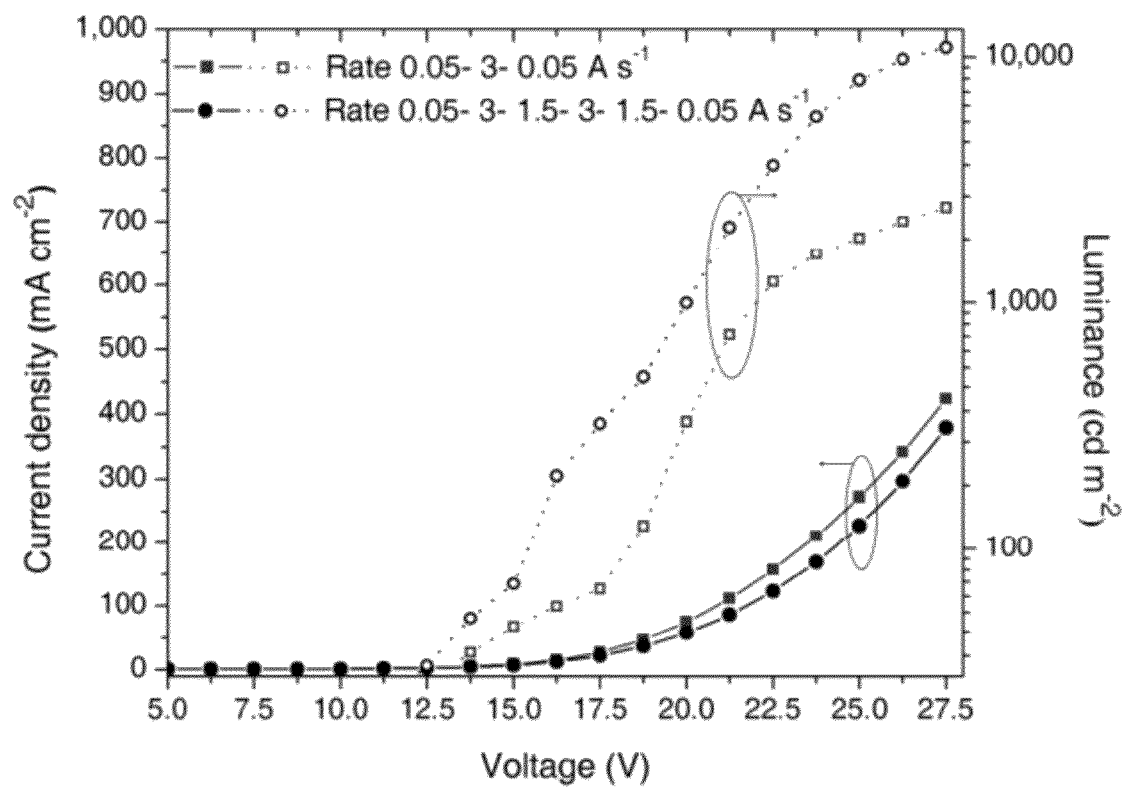
FIG. 5 illustrates a graph showing the current densities and luminances of two OLEDs having different periodic grain sizes of $Alq_3$ particles in their emitting layers as a function of applied voltage.

As shown in FIG. 5, the periodic $Alq_3$ particle size results in both increased current density and improved luminance of the OLED. In FIG. 5, the current densities and luminances of two example OLEDs having the same structure as the OLEDs of FIG. 1 are illustrated. The current densities of the two OLEDs are shown by the solid lines and the luminances of the two OLEDs are shown by the dashed lines in FIG. 5. In the first OLED, the deposition rate of the $Alq_3$ particles in the emitting layer 110 is gradually increased from 0.05 Å/s at the interface of the hole transport layer 108 to 3 Å/s and then gradually decreased back to 0.05 Å/s at the interface of the cathode 112. In the second OLED, the deposition rate of the $Alq_3$ particles in the emitting layer 110 is gradually increased from 0.05 Å/s at the interface of the hole transport layer 108 to 3 Å/s, gradually decreased to 1.5 Å/s, gradually increased back to 3 Å/s, then gradually decreased back to 1.5 Å/s, and finally decreased back to 0.05 Å/s at the interface of the cathode 112, as described above with reference to FIG. 2.

As shown in FIG. 5, not only are both the current density and luminance of the second OLED with the emitting layer 110 having the structure shown in FIG. 2 higher than those of the first OLED of FIG. 5, but they are also significantly higher than those of the four OLEDs of FIG. 4 without the periodic deposition rate of the emitting layer 110. The two layers of the largest $Alq_3$ particles in the second OELD of FIG. 5 impede the mobility of the holes and the electrons, thereby increasing the likelihood of electron-hole recombination relative to the single layer of the largest $Alq_3$ particles in the first OLED of FIG. 5.

Figure 6:
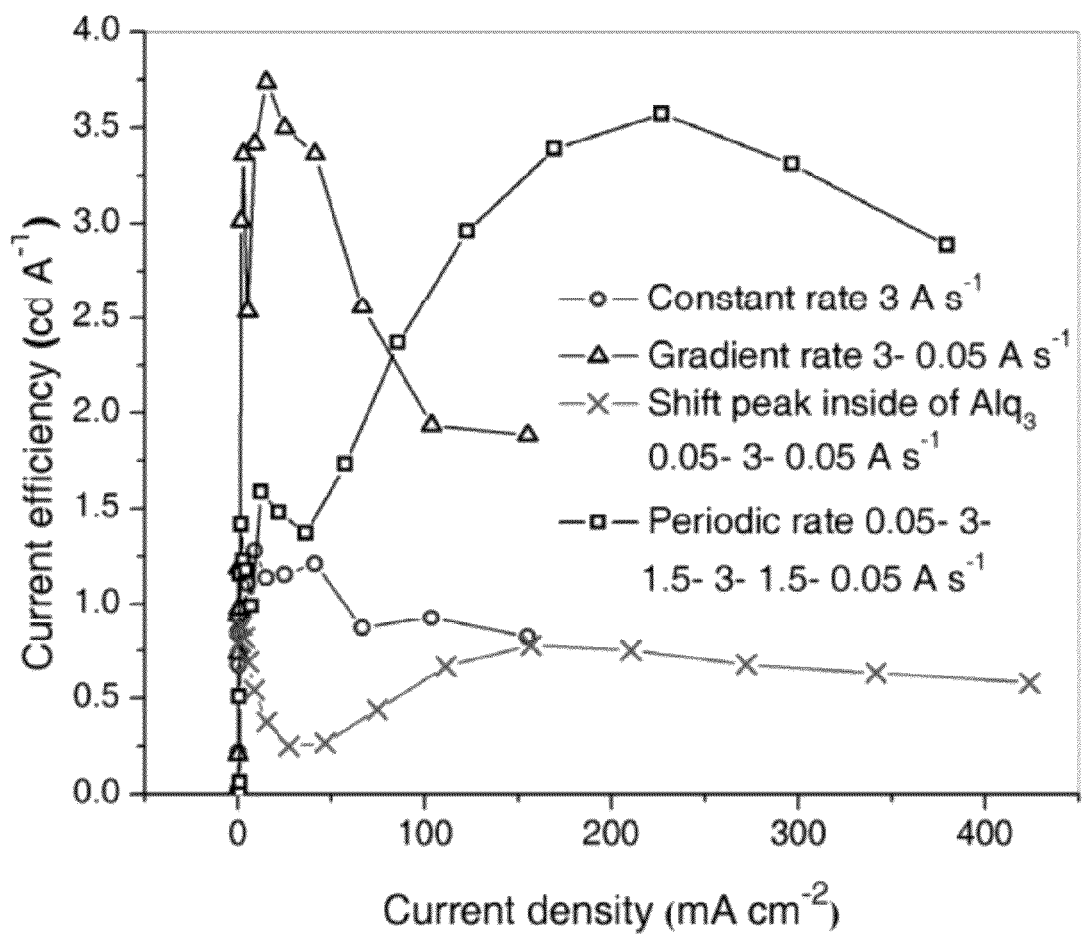
FIG. 6 illustrates a graph showing the current efficiencies of four OLEDs having different models of grain size distributions of $Alq_3$ particles in their emitting layers as a function of current density.

As shown in FIG. 6, the periodic $Alq_3$ particle size also results in increased current efficiency of the OLED. In FIG. 6, the current efficiencies of four OLEDs having the same structure as the OLEDs of FIG. 1 are illustrated. In the first OLED, the deposition rate of the $Alq_3$ particles in the emitting layer 110 is constant at 3 Å/s. In the second OLED, the deposition rate of the $Alq_3$ particles is gradually decreased from 3 Å/s at the hole transport layer 108 to 0.05 Å/s at the cathode 112. In the third OLED, the deposition rate of the $Alq_3$ particles in the emitting layer 110 is periodic and gradually increased from 0.05 Å/s at the interface of the hole transport layer 108 to 3 Å/s and then gradually decreased back to 0.05 Å/s at the interface of the cathode 112. In the fourth OLED, the deposition rate of the $Alq_3$ particles in the emitting layer 110 is gradually increased from 0.05 Å/s at the interface of the hole transport layer 108 to 3 Å/s, gradually decreased to 1.5 Å/s, gradually increased back to 3 Å/s, then gradually decreased back to 1.5 Å/s, and finally decreased back to 0.05 Å/s at the interface of the cathode 112, as described above with reference to FIG. 2

As shown in FIG. 6, the fourth OLED with the periodic structure of emitting layer 110 shown in FIG. 2 maintains its high current efficiency at operation currents. The fourth OLED has a current efficiency peak of 3.6 cd/A at 227 mA/cm².

Recombination probability ($P_R$) is defined by the transit time ($\tau_t$) and the recombination time ($\tau_{rec}$) of the holes and electrons in the emitting layer 110 according to equation (1), below:

$$P_R = \frac{\tau_t}{1 + \tau_{rec}} \quad (1)$$

To increase the probability of electron-hole recombination in the emitting layer 110, either the transit time must be increased or the recombination time must be decreased. In the OLED 100, the recombination time is decreased by controlling the mobility of the electrons and the holes in the emitting layer 110 by increasing the injection rate of the carriers using smaller $Alq_3$ particle sizes at the upper and lower boundaries of the emitting layer 110. The recombination time of the OLED 100 is decreased by populating the carriers at the center of the emitting layer 110 using larger $Alq_3$ particle sizes.

Moreover, according to the Onsager theory of recombination, a collision between an electron and a hole will be effective in producing recombination within a critical radius. Because the dielectric coefficient of $Alq_3$ is about 4, the critical radius in the emitting layer 110 is about 150 Å. The average distance across a sphere having a radius of 150 Å is 20 nm. As such, the distance between the two layers of the largest $Alq_3$ particles 206, the sum of thicknesses 212 and 214, is configured to be 20 nm. Therefore, the emitting layer 110 is configured to assure the highest likelihood of recombination, resulting in increased illumination and durability of the OLED 100.

It is to be understood that the disclosed implementations are not limited to the particular processes, devices, and/or apparatus described which may, of course, vary. It is also to be understood that the terminology used herein is for the purpose of describing particular embodiments only, and is not intended to be limiting. As used in this application, the singular forms "a," "an," and "the" include plural referents unless the content clearly indicates otherwise.

Reference in the specification to "one implementation" or "an implementation" means that a particular feature, structure, characteristic, or function described in connection with the implementation is included in at least one implementation herein. The appearances of the phrase "in some implementations" in the specification do not necessarily all refer to the same implementation.

Accordingly, other embodiments and/or implementations are within the scope of this application.

What is claimed is:

1. An organic light emitting diode, comprising:
   a substrate, the substrate being made of a non-conductive, transparent material;
   an anode over the substrate, the anode being made of a conductive, transparent material;
   an emitting layer over the anode, the emitting layer comprising:
     first small particles at the lower boundary of the emitting layer,
     first intermediate-sized particles over the first small particles,
     first large particles over the first intermediate-sized particles,
     second intermediate-sized particles over the first large particles,
     second large particles over the second intermediate-sized particles,
     third intermediate-sized particles over the second large particles, and
     second small particles over the third intermediate-sized particles at the upper boundary of the emitting layer; and
   a cathode over the emitting layer, the cathode being made of a metal, wherein
   the large particles of the emitting layer are larger than the intermediate-sized particles of the emitting layer and the intermediate-sized particles of the emitting layer are larger than the small particles of the emitting layer.

2. The organic light emitting diode of claim 1, wherein the emitting layer is made of tris(8-hydroxyquinoline) aluminum.

3. The organic light emitting diode of claim 1, wherein the thickness of the emitting layer is 65 nanometers.

4. The organic light emitting diode of claim 3, wherein the thickness of the emitting layer between the first small particles and the first large particles is 10 nanometers.

5. The organic light emitting diode of claim 3, wherein the thickness of the emitting layer between the first large particles and the second intermediate-sized particles is 10 nanometers.

6. The organic light emitting diode of claim 3, wherein the thickness of the emitting layer between the second intermediate-sized particles and the second large particles is 10 nanometers.

7. The organic light emitting diode of claim 3, wherein the thickness of the emitting layer between the second large particles and the third intermediate-sized particles is 20 nanometers.

8. The organic light emitting diode of claim 3, wherein the thickness of the emitting layer between the third intermediate-sized particles and the second small particles is 15 nanometers.

9. The organic light emitting diode of claim 1, wherein the substrate is made of transparent glass.

10. The organic light emitting diode of claim 1, wherein the anode is made of indium tin oxide.

11. The organic light emitting diode of claim 1, further comprising a hole injection layer over the anode, the hole injection layer being made of polymer.

12. The organic light emitting diode of claim 11, wherein the hole injection layer is made of poly(ethylenedioxy)thiophene:poly(styrenesulfonate).

13. The organic light emitting diode of claim 11, wherein the thickness of the hole injection layer is between 5 nanometers and 100 nanometers.

14. The organic light emitting diode of claim 11, further comprising a hole transport layer over the hole injection layer, the hole transport layer being made of another polymer different from the polymer of the hole injection layer.

15. The organic light emitting diode of claim 14, wherein the hole transport layer is made of poly(9-vinylcarbazole).

16. The organic light emitting diode of claim 14, wherein the thickness of the hole transport layer is between 50 nanometers and 200 nanometers.

17. The organic light emitting diode of claim 1, wherein the cathode is made of aluminum.

18. The organic light emitting diode of claim 1, wherein the anode is electrically connected to the cathode.

* * * * *